(12) United States Patent
Schultz et al.

(10) Patent No.: US 7,806,560 B2
(45) Date of Patent: **\*Oct. 5, 2010**

(54) LED ILLUMINATION ASSEMBLY WITH COMPLIANT FOIL CONSTRUCTION

(75) Inventors: John C. Schultz, Afton, MN (US); Andrew J. Ouderkirk, Woodbury, MN (US); Joel S. Peiffer, Maplewood, MN (US); Nelson B. O'Bryan, Tamworth, NH (US); John A. Wheatley, Lake Elmo, MN (US); Cameron T. Murray, Lake Elmo, MN (US)

(73) Assignee: 3M Innovative Properties Company, Saint Paul, MN (US)

( \* ) Notice: Subject to any disclaimer, the term of this patent is extended or adjusted under 35 U.S.C. 154(b) by 0 days.

This patent is subject to a terminal disclaimer.

(21) Appl. No.: 12/499,171

(22) Filed: Jul. 8, 2009

(65) Prior Publication Data

US 2009/0273925 A1   Nov. 5, 2009

Related U.S. Application Data

(62) Division of application No. 11/669,622, filed on Jan. 31, 2007, now Pat. No. 7,572,031.

(51) Int. Cl.
*F21V 33/00* (2006.01)
(52) U.S. Cl. ............................. 362/249.02; 362/249.04; 362/800
(58) Field of Classification Search ................ 362/800, 362/249.02, 249.04, 249.08
See application file for complete search history.

(56) References Cited

U.S. PATENT DOCUMENTS

| 6,250,774 | B1 | 6/2001 | Begemann et al. |
| 6,274,224 | B1 | 8/2001 | O'Bryan et al. |
| 6,577,492 | B2 | 6/2003 | O'Bryan et al. |
| 6,638,378 | B2 | 10/2003 | O'Bryan et al. |
| 6,657,297 | B1 | 12/2003 | Jewram et al. |
| 6,799,902 | B2 | 10/2004 | Anderson et al. |
| 2001/0001207 | A1 | 5/2001 | Shimizu et al. |
| 2002/0113244 | A1 | 8/2002 | Barnett et al. |
| 2003/0001488 | A1 | 1/2003 | Sundahl |
| 2003/0063465 | A1 | 4/2003 | McMillan et al. |
| 2003/0153099 | A1 | 8/2003 | Jiang et al. |
| 2005/0116235 | A1 | 6/2005 | Schultz et al. |

(Continued)

FOREIGN PATENT DOCUMENTS

FR    2 622 896    6/1991

(Continued)

OTHER PUBLICATIONS

Peiffer, Joel S., "Embedded Capacitor Material Evaluation", Presented at IPC SMEMA Council APEX$^{SM}$, www.GoApex.org, pp. 1-4, 2001.

(Continued)

*Primary Examiner*—Laura Tso

(57) ABSTRACT

An illumination assembly includes a compliant substrate comprising a first and second electrically conductive foil separated by an electrically insulating layer. The insulating layer includes a polymer material loaded with particles that enhance thermal conductivity of the insulating layer. A plurality of LED dies are disposed on the first conductive foil.

2 Claims, 6 Drawing Sheets

U.S. PATENT DOCUMENTS

2005/0265029 A1    12/2005    Epstein et al.
2006/0012991 A1    1/2006    Weaver, Jr. et al.
2006/0098438 A1    5/2006    Ouderkirk et al.

FOREIGN PATENT DOCUMENTS

WO    WO 2005/099323    10/2005

OTHER PUBLICATIONS

Peiffer, Joel S., "Ultra-Thin, Loaded Epoxy Materials for Use as Embedded Capacitor Layers", Thin Laminates, Printed Circuit Design & Manufacture, pp. 40-42, Apr. 2004.

Peiffer, Joel S., "The History of Embedded Distributed Capacitance", Embedded Capacitance Patents, Printed Circuit Design & Manufacture, pp. 32-37, Aug. 2004.

Peiffer et al., "Electrical Performance Advantages of Ultra-Thin Dielectric Materials Used for Power-Ground Cores in High Speed, Multilayer Printed Circuit Boards", http://multimedia.mmm.com/mws/mediawebserver.dyn?FFFFFFoMYRUF&i2Fsi2FFFdmNqBeeeeD-, Previously presented at IPC Expo 2003.

Xu et al., "Power-Bus Decoupling With Embedded Capacitance in Printed Circuit Board Design", IEEE Transactions on Electromagnetic Compatibility, vol. 45, No. 1, Feb. 2003.

LED ILLUMINATION ASSEMBLY WITH COMPLIANT FOIL CONSTRUCTION

CROSS REFERENCE TO RELATED APPLICATIONS

This application is a divisional of U.S. Ser. No. 11/669,622, filed Jan. 31, 2007, now U.S. Pat. No. 7,572,031, the disclosure of which is incorporated by reference in its entirety herein.

FIELD OF THE INVENTION

The present invention relates to light emitting diode (LED) devices, liquid crystal display (LCD) devices, components therefor, and related articles and processes.

BACKGROUND

LEDs are a desirable choice of light source in part because of their relatively small size, low power/current requirements, rapid response time, long life, robust packaging, variety of available output wavelengths, and compatibility with modern circuit construction. These characteristics may help explain their widespread use over the past few decades in a multitude of different end use applications. Improvements to LEDs continue to be made in the areas of efficiency, brightness, and output wavelength, further enlarging the scope of potential end-use applications.

Recently, LEDs have begun to be used for backlighting purposes in LCD television devices, as well as other types of lighting and display systems. For most lighting applications, it is necessary to have a plurality of LEDs to supply the required light intensity. Because of their relatively small size, a plurality of LEDs can be assembled in arrays having small dimensions and a high luminance or irradiance.

It is possible to achieve an increase in the light density of an array of LEDs by increasing the packing density of the individual LEDs within the array. An increase in packing density can be achieved by increasing the number of LEDs within the array without increasing the space occupied by the array, or by maintaining the number of LEDs within the array and decreasing the array dimensions. However, tightly packing large numbers of LEDs in an array is a long term reliability concern since local heating, even with a globally efficient thermal conduction mechanism, can reduce the lifespan of the LEDs. Therefore, dissipating the heat generated by the array of LEDs becomes more important as the packing density of the LEDs increases. In other applications, even those without high packing densities, the driving voltages/currents and brightness of LED dies are increasing, leading to increases in local temperatures around the LED dies. Consequently, there is a need for better heat dissipation at the location of each LED die, as well as across the array.

Conventional LED mounting techniques use packages like that illustrated in U.S. Patent Application Publication 2001/0001207A1 (Shimizu et al.), that are unable to quickly transport the heat generated in the LED away from the LED. As a consequence, performance of the device is limited. More recently, thermally enhanced packages have become available, in which LEDs are mounted and wired on electrically insulating but thermally conductive substrates such as ceramics, or with arrays of thermally conductive vias (e.g., U.S. Patent Application Publication 2003/0001488A1 (Sundahl)), or use a lead frame to electrically contact a die attached to a thermally conductive and electrically conductive thermal transport medium (e.g., U.S. Patent Application Publication 2002/0113244A1 (Barnett et al.)). An illumination assembly having improved thermal properties is disclosed in U.S. Patent Application Publication 2005/0116235A1 (Schultz et al.), in which an illumination assembly includes a plurality of LED dies disposed on a substrate having an electrically insulative layer on a first side of the substrate and an electrically conductive layer on a second side of the substrate. Each LED die is disposed in a via extending through the electrically insulative layer on the first side of the substrate to the electrically conductive layer on the second side of the substrate, and each LED die is thermally and electrically connected through the via to the electrically conductive layer. The electrically conductive layer is patterned to define a plurality of electrically isolated heat spreading elements which are in turn disposed adjacent a heat dissipation assembly.

Applicants of the present application have found that, although the more recent approaches improve the thermal properties of LED arrays, there are disadvantages to these approaches. Specifically, the substrates on which the LED arrays are disposed have limited ability to form local features having sizes useful for fully using, controlling, and manipulating the light emitted from the LEDs.

BRIEF SUMMARY

The present application discloses, inter alia, illumination assemblies that include a compliant substrate having a first and second electrically conductive foil separated by an electrically insulating layer. The insulating layer includes a polymer material loaded with particles that enhance thermal conductivity of the insulating layer. A plurality of LED dies are preferably disposed on the first conductive foil.

In exemplary embodiments, the compliant substrate has at least one deformation, and at least one of the LED dies is disposed on or in the deformation. In some embodiments, the first and second electrically conductive foils and the electrically insulating layer are altered to control the optical properties of the substrate.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

In the Figures, like reference numerals designate like elements. The Figures are idealized, not drawn to scale, and intended for illustrative purposes only.

DETAILED DESCRIPTION OF ILLUSTRATIVE EMBODIMENTS

We describe herein illumination assemblies that include LED dies. In this regard, "light emitting diode" or "LED" refers to a diode that emits light, whether visible, ultraviolet, or infrared. It includes incoherent encased or encapsulated semiconductor devices marketed as "LEDs", whether of the conventional or super radiant variety. If the LED emits non-visible light such as ultraviolet light, and in some cases where it emits visible light, it can be packaged to include an organic or inorganic phosphor (or it may illuminate a remotely disposed phosphor) to convert short wavelength light to longer wavelength visible light, in some cases yielding a device that emits white light. An "LED die" is an LED in its most basic form, i.e., in the form of an individual component or chip made by semiconductor processing procedures. For example, the LED die is ordinarily formed from a combination of one or more Group III elements and of one or more Group V elements (III-V semiconductor). Examples of suitable III-V semiconductor materials include nitrides, such as gallium nitride, and phosphides, such as indium gallium phosphide. Other types of III-V materials can be used also, as might inorganic materials from other groups of the periodic table. The component or chip can include electrical contacts suitable for application of power to energize the device. Examples include wire bonding, tape automated bonding (TAB), or flip-chip bonding. The individual layers and other functional elements of the component or chip are typically formed on the wafer scale, and the finished wafer can then be diced into individual piece parts to yield a multiplicity of LED dies. The LED die may be configured for surface mount, chip-on-board, or other known mounting configurations. Some packaged LEDs are made by forming a polymer encapsulant formed over an LED die and an associated reflector cup.

As described further below, the LED dies can be disposed on a compliant substrate. In this regard, a foil, a substrate, or other thin article is referred to as "compliant" if localized force or pressure can be used to permanently deform the article without substantial cracking or loss of functionality. The deformation, which may be a protrusion or a depression, can be isolated to only a portion of the article, such that if the article is laid flat, the deformation is bounded on all sides by flat portions of the article. Stated differently, the deformation can have a compound curvature, i.e., can be curved (whether smoothly varying, as in the case of a hemisphere, or piecewise discontinuous, as in the case of a pyramidal shape with flat facets) in each of two mutually perpendicular reference planes, the reference planes being perpendicular to the plane of the article. Preferably, the permanent deformation can be produced with moderate pressures, such as those achieved by pressing a small blunt object against the article by hand.

Figure 1:
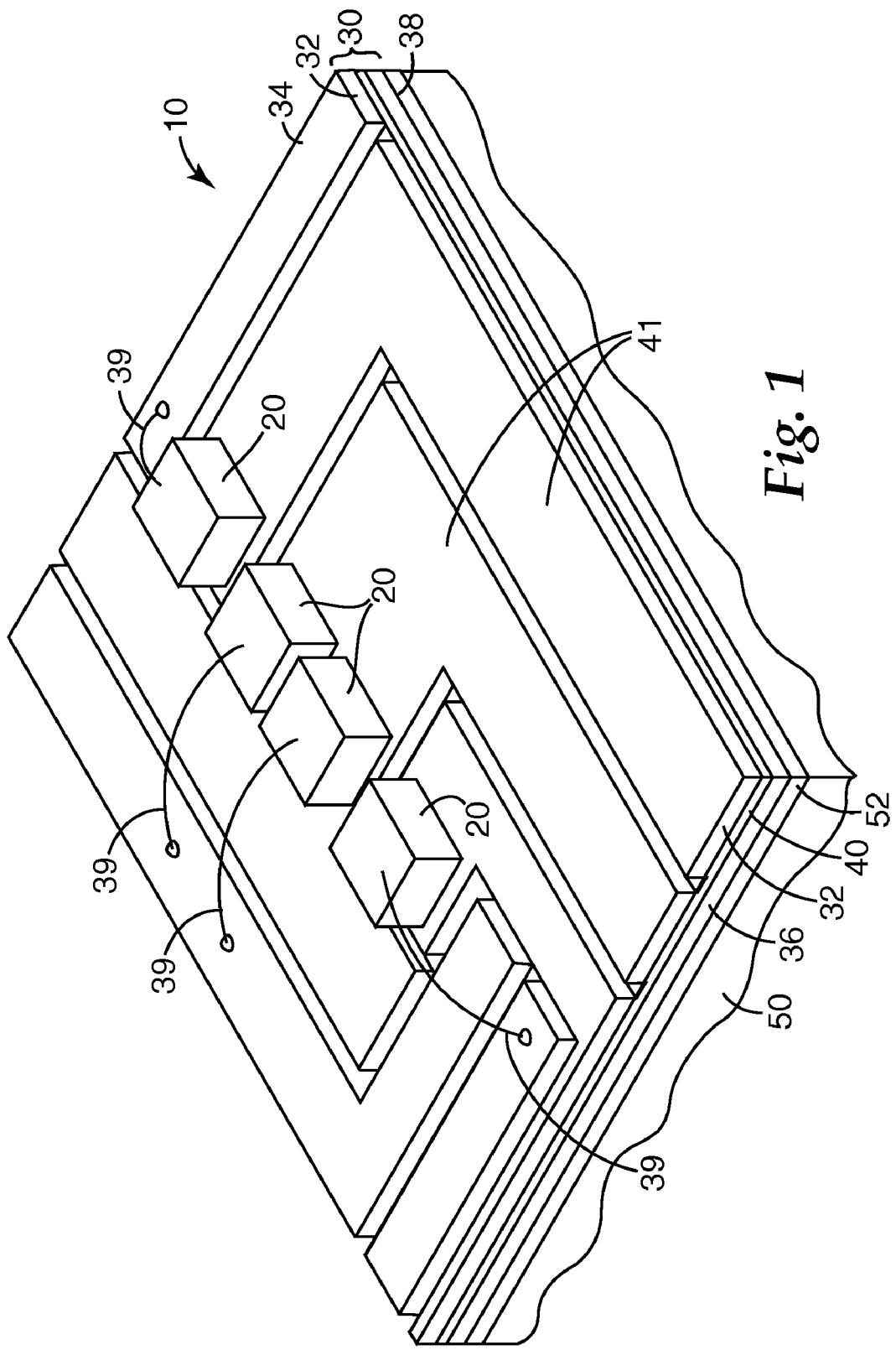
FIG. 1 is a perspective illustration of a portion of an illumination assembly.

Turning now to FIG. 1, a perspective view of a portion of an illumination assembly 10 is illustrated. The illumination assembly 10 includes a plurality of LED dies 20 disposed in an array on a compliant substrate 30. The LED dies 20 can be selected to emit a preferred wavelength, such as in the red, green, blue, ultraviolet or infrared spectral regions. The LED dies 20 can each emit in the same spectral region, or in different spectral regions. In some cases, the LED dies 20 are nominally 250 µm tall.

The compliant substrate 30 includes a first electrically conductive layer 32 defining a top surface 34 of the substrate, and a second electrically conductive layer 36 defining a bottom surface 38 of the substrate 30. The first and second electrically conductive layers 32, 36 are separated by an electrically insulating layer 40. As illustrated, the first electrically conductive layer 32 is patterned to form electrical circuit traces 41, and the LED dies 20 are disposed on and electrically connected to the first conductive layer 36. The illustrated circuit traces 41 are exemplary only.

The second electrically conductive layer 36 of substrate 30 is disposed adjacent a heat sink or heat dissipation assembly 50, and is thermally coupled thereto by a layer 52 of thermal interface material. The heat dissipation assembly 50 can be, for example, a heat dissipation device, commonly called a heat sink, made of a thermally conductive metal such as aluminum or copper, or a thermally conductive polymer such as a carbon-filled polymer. The layer 52 of thermal interface material may comprise any suitable material, including adhesives, greases, and solder. The thermal interface material of layer 52 may be, for example, a thermally conductive adhesive material such as a boron nitride loaded polymer (e.g., 3M™ Thermally Conductive Tape 8810 sold by 3M Company), or a thermally conductive non-adhesive material such as a silver filled compound (e.g., Arctic Silver™ 5 High-Density Polysynthetic Silver Thermal Compound sold by Arctic Silver Incorporated of Visalia, Calif., U.S.A.). Preferably, heat dissipation assembly 50 has a thermal impedance as small as possible, preferably less than 1.0° C./W. In some cases, heat dissipation assembly 50 preferably has a thermal impedance in the range of 0.5 to 4.0° C./W. The material of layer 52 desirably has a thermal conductivity in the range of 0.1 W/m-K to 10 W/m-K, preferably at least 1 W/m-K.

In the illumination assembly 10 of FIG. 1, the LED dies 20 are of the type having electrical contacts on opposed sides of the LED die, referred to as the base and top surface of the die. The contact on the base of each LED die 20 is electrically and thermally connected to a circuit trace 41 immediately beneath the LED die 20. The contact on the top of each LED die 20 is electrically connected to another circuit trace 41 by a wirebond 39 extending from LED die 20. To facilitate good wirebonding, first conductive layer 32 can include a surface metallization of nickel and gold.

Figure 2:
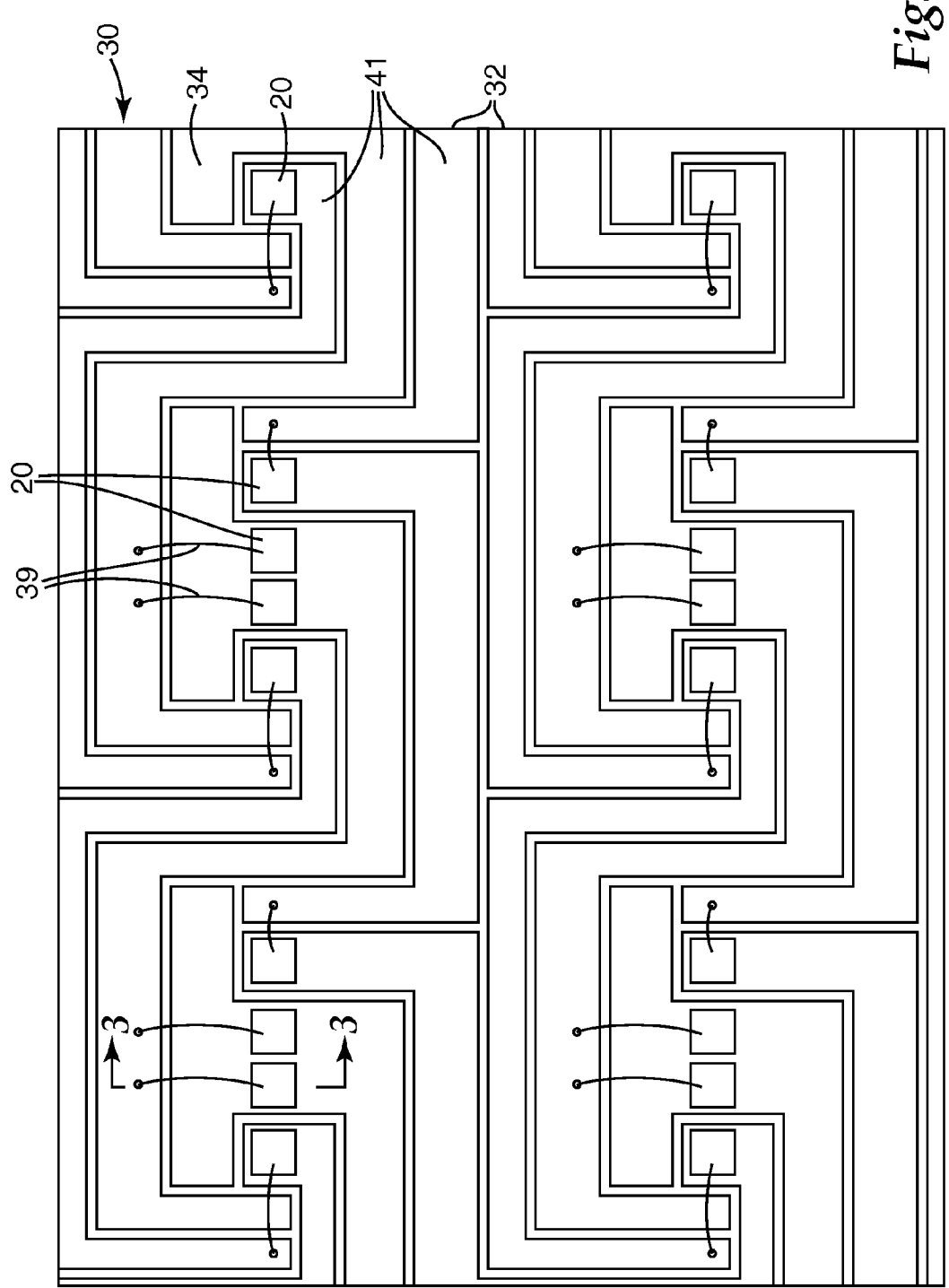
FIG. 2 is a top plan view of a portion of the illumination assembly of FIG. 1, showing a larger surface area of the illumination assembly.

The pattern of first conductive layer 32 of FIG. 1 is best seen in FIG. 2. First conductive layer 32 is patterned to define a plurality of circuit traces 41. Each circuit trace 41 is positioned for electrical and thermal coupling to an associated LED die 20 and also to an associated wirebond 39, such that at least some LED dies 20 are electrically connected in series, based on requirements of the particular application. As best seen in FIG. 2, instead of patterning first conductive layer 32 to provide only narrow conductive wiring traces to electrically connect the LED dies 20, the first conductive layer 32 can be patterned to remove only as much conductive material as is necessary to electrically isolate the circuit traces 41, leaving as much of first conductive layer 32 as possible to act as a reflector for the light emitted by LED dies 20. Leaving as much of first conductive layer 32 as possible also results in wider circuit traces that are useful for applications requiring short high current pulses. The wider traces allow a higher current density to be delivered, even over very short times.

In some embodiments, the material of first conductive layer 32 is selected to provide the desired optical properties (e.g., reflectance, color, scattering, diffraction, or a combination of these properties) for the particular application. In other embodiments, the optical properties of top surface 34 of first conductive layer 32 are enhanced by plating and/or coating to provide the desired optical properties. In some embodiments, top surface 34 is plated, and then the exposed surface of the plating is coated to improve the optical performance. Suitable coating and plating materials include silver, passivated silver, gold, rhodium, aluminum, enhanced reflectivity aluminum, copper, indium, nickel (e.g., immersion, electroless or electroplated nickel), chromium, tin, and alloys thereof. In some embodiments, a coating may comprise a white coating such as a highly reflective white polymer, e.g., Starbrite EF reflective coatings sold by Spraylat Corporation, Pelham, N.Y. Multilayer dielectric stacks can also be deposited on the surface 34 of layer 32 for enhanced reflectivity. Suitable coatings may also include metal and semiconductor oxides, carbides, nitrides, as well as mixtures and compounds thereof. These coatings may be electrically conductive or insulating depending upon the intended application. Suitable coating methods include sputtering, physical vapor deposition, and chemical vapor deposition. The coating process may optionally be ion assisted. The optical properties of the conductive layer 32 and platings or coatings thereon can also be modified by controlling the surface texture of the surface 34 and/or the platings and coatings described previously. For example an optically smooth surface finish may be preferred in some cases, a matte or somewhat roughened surface finish in other cases. In other embodiments, optical films, such as Vikuiti™ Enhanced Specular Reflectivity (ESR) film sold by 3M Company, may also be applied to one or both major surfaces of the first layer 32 to increase desirable optical properties, e.g., specular or diffuse reflectivity.

Figure 3:
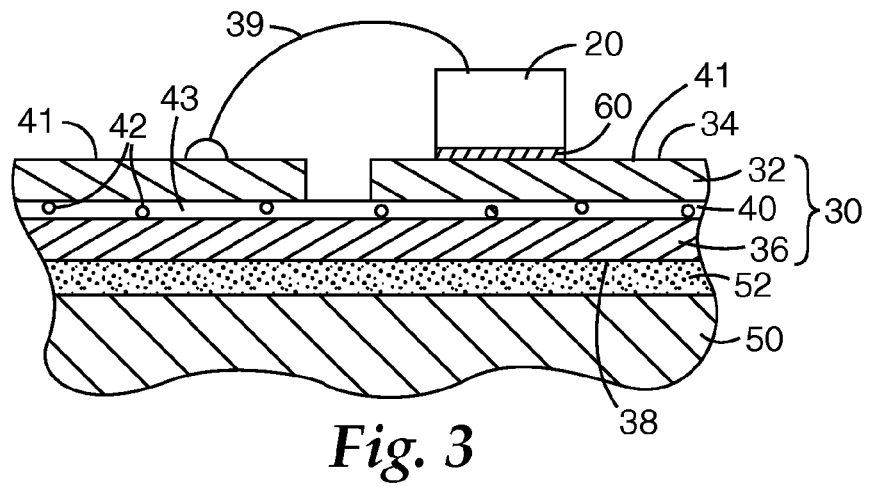
FIG. 3 is an enlarged cross-sectional illustration taken along line 3-3 of FIG. 2.

As shown in FIG. 3, the electrically insulating layer 40 of substrate 30 comprises a polymer material 43 loaded with particles 42 that enhance thermal conductivity of the insulating layer 40. The polymer material 43 and/or particles 42 can also be selected to alter the electrical, thermal, optical and/or mechanical properties of the insulating layer 40. When the electrical design includes large areas of exposed electrically insulating layer 40 near the LEDs, the optical properties (e.g., reflectivity, diffusivity, transparency) of the electrically insulating layer 40 can also be enhanced.

As mentioned above, the polymer material 43 and/or particles 42 can be selected to enhance the reflectivity of the insulating layer 40. For example, insulating layer 40 can be loaded with white, diffusely reflective materials e.g., $BaSO_4$, $TiO_2$, or with high refractive index materials, e.g., diamond, SiC, $Al_2O_3$, or with reflective materials, e.g., silver flakes or nanoparticle materials or materials oriented with electrical/magnetic means for desired optical properties such as ferroelectrics, e.g., PLZT. Alternatively, the polymer material 43 and/or particles 42 can be selected to cause the insulating layer 40 to be substantially transparent. In this case the optical properties of the coated side of the second electrically conductive layer 36 may be selected or altered to provide desired characteristics (e.g., reflectivity, diffusivity). In other embodiments, the polymer material 43 and/or particles 42 are selected to cause the insulating layer 40 to have a desired apparent color.

In each of these embodiments, an encapsulant may be provided on each LED die 20 to help couple light out of the die, and/or to preferentially direct the emitted light towards the insulating layer 40 to be reflected (whether specularly or diffusely), polarized, or waveguided by the insulating layer 40. The macro-, micro-, and nanostructure of the insulating layer 40 can be engineered for specific optical properties by pre-forming the inner major surfaces of the metal foils (i.e., the interface of electrically insulating layer 40 with first electrically conductive layer 32 and with second electrically conductive layer 36. For example, the inner surface of a copper foil can be structured by chemical (grain etching), mechanical (embossing), or optical (laser ablation) means. The exposed insulating layer 40 interface will be the inverse or mirror image of the metal film pre-form. The optical properties of the insulating layer 40 can also be modified by the addition of one or more phosphor or fluorescent materials into the insulating layer 40 so that a shift in the wavelength of the incident radiation occurs. Efficient removal of the Stokes shift energy in these cases of wavelength conversion is an additional benefit.

In some cases, the electrically insulating layer 40 is prepared from a blend of resin and particles. Suitable resins include epoxies and blends thereof. Commercially available epoxies include Epon™ 1001F epoxy resin sold by Resolution Performance Products, and XP71756 epoxy sold by Vantico Inc. The resin can withstand temperatures that would be encountered in a typical solder reflow operation, for example, in the range of about 180 to about 290° C. Preferably, the resin can withstand short term exposure to temperatures over 300° C. needed to reflow 80/20 gold/tin solder commonly used for LED die attachment. These resins may be dried or cured to form the electrically insulating layer.

The particles 42 are preferably selected to enhance the thermal conductivity of the insulating layer 40. Any suitable materials can be chosen for this purpose. In exemplary embodiments, the particles are composed of silicon carbide, aluminum oxide, boron nitride, diamond, or more complex, engineered materials such as metallic particles with electrically insulating coatings or nanoparticles. The particles can be dielectric (electrically insulating) or electrically conductive or mixtures thereof, provided that the overall effect of the blend of resin and particles is electrically insulative with adequate thermal conductivity for the intended application.

Exemplary dielectric or electrically insulating particles include barium titanate, barium strontium titanate, titanium oxide, lead zirconium titanate, boron, boron nitride, diamond, alumina, beryllium, silicon, as well as other carbides, oxides, and nitrides of those materials, and compounds or mixtures thereof. A commercially available barium titanate is available from Nippon Chemical Industrial Co., Tokyo, Japan, under the trade designation "BESPA AKBT."

Exemplary electrically conductive particles may comprise electrically conductive or semiconductive materials such as metal or metal alloy particles, where the metal may be silver, nickel, or gold; nickel-coated polymer spheres; gold-coated polymer spheres (commercially available from JCI USA Inc., New York, N.Y., under product designation number "20 GNR4.6-EH"); or mixtures thereof.

The particles may be any shape and may be regularly or irregularly shaped. Exemplary shapes include spheres, platelets, cubes, needles, oblate, spheroids, pyramids, prisms, flakes, rods, plates, fibers, chips, whiskers, and mixtures thereof. The particle size, i.e., the smallest dimension of the particle, typically ranges from about 0.05 to about 11 µm, preferably 0.05 to 3 µm, more preferably 0.05 to 2 µm. Particles can be substantially the same size, or mixtures of different sizes of particles can be used. In order to form a sufficiently smooth insulating layer 40 for the promotion of adhesion with first and second electrically conductive layers 32, 36, the average size of the particles is desirably a fraction of the thickness of the electrically insulating layer 40. In some embodiments, the average size of the particles is less than about ½ of the thickness of the electrically insulating layer 40, preferably less than about ¼ Of the thickness of the electrically insulating layer 40, more preferably less than about ¹⁄₁₀ of the thickness of the electrically insulating layer 40.

The loading of particles in the polymer is typically 20 to 60% by volume, based on the total volume of the electrically insulating layer. Particle distribution may be random or ordered. Loading of particles in the polymer may be greater than 60% by volume if surfaces of the first and second electrically conductive layers 32, 36 that adjoin insulating layer 40 are treated to provide improved adhesion with the insulating layer 40. Exemplary surface treatments that are useful in providing improved adhesion include 5-aminobenzotriazole and 3-glycidoxypropyltrimethoxysilane, corona discharge, plasma ashing/etching, self-assembled monolayers, and reactive layers to bind the resin matrix material to the first and second electrically conductive layers 32, 36.

Metal foils can also be treated with anti-corrosion treatments to improve adhesion (e.g., the use of zinc/chromium treatments for copper foil).

Typically, the thickness of the electrically insulating layer 40 ranges from about 0.5 to about 40 µm, preferably less than about 20 µm.

In some embodiments, the first and second electrically conductive layers 32, 36 comprise an electrically conductive foil. The electrically conductive foils are composed of a metal or conductive plastic. Suitable metal foils include copper, aluminum, nickel, gold, silver, palladium, tin, lead, and combinations thereof, for example aluminum clad copper foil. When the first and second electrically conductive layers are metal foils, the metal preferably has an anneal temperature which is at or below the temperature for curing the electrically insulating layer, or the metal is annealed before the electrically insulating layer is coated.

Typically, the first and second electrically conductive foil layers have a thickness ranging from 0.5 to 8 mils (approximately 10 to 200 µm), more preferably 0.5 to 1.5 mils (approximately 10 to 38 µm). Furthermore, it is often desirable for the first and second electrically conductive foil layers to each be thicker than the insulating layer. In some cases, the thickness of the first conductive foil layer 32 is approximately the same as that of the second conductive foil layer 36. In other cases, the thickness of the first conductive foil layer 32 is different than that of the second conductive foil layer 36. In some cases, the thickness of the second conductive foil layer 36 is greater than that of the first conductive foil layer 32, such that second conductive foil layer 36 functions to more effectively spread heat laterally from the location of an LED die 20.

FIG. 3 is an enlarged sectional view taken along line 3-3 of FIG. 2. The LED die 20 is positioned on the top surface 34 of first conductive layer 32 and electrically connected to the circuit trace of first conductive layer 32 with a layer 60 of either isotropically conductive adhesive (for example, Metech 6144S, available from Metech Incorporated of Elverson, Pa., U.S.A.,), or an anisotropically conductive adhesive, or solder. Solders typically have a lower thermal resistance than adhesives, but not all LED dies have solderable base metallization. Solder attachment can also have the advantage of LED die 20 self-alignment, due to the surface tension of the molten solder during processing. Some LEDs may be supplied with a high temperature 80/20 gold/tin solder which can be reflowed to form a very stable, low thermal resistance interface capable of withstanding subsequent soldering processes up to 300° C. However, some LED dies 20 may be sensitive to solder reflow temperatures, making an adhesive preferable in layer 60.

Figure 4:
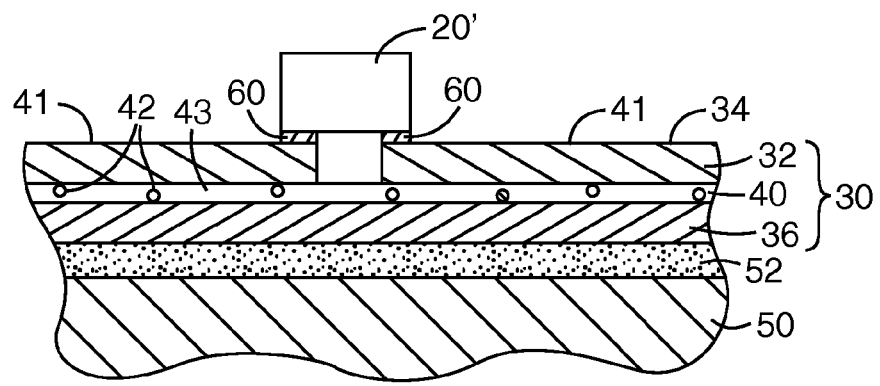
FIG. 4 is an enlarged cross-sectional illustration showing another illumination assembly.

Referring now to FIG. 4, a cross-sectional illustration of another illumination assembly shows an LED die 20' having both electrical contact pads on the same side of the LED die, rather than on opposite sides of the diode as in the wirebonded embodiments of FIGS. 1-3. Depending upon the design of the LED die 20', light is emitted from the side of the diode 20' that is opposite the contact pads, or from the side of the diode 20' that is on the same side as the contact pads. As with the wirebond LED dies 20 of FIGS. 1-3, electrically conductive adhesives, anisotropically conductive adhesives, or solder re-flow are among the attachment methods that can be used to attach the LED die 20' to the first conductive layer 32.

Figure 5A:
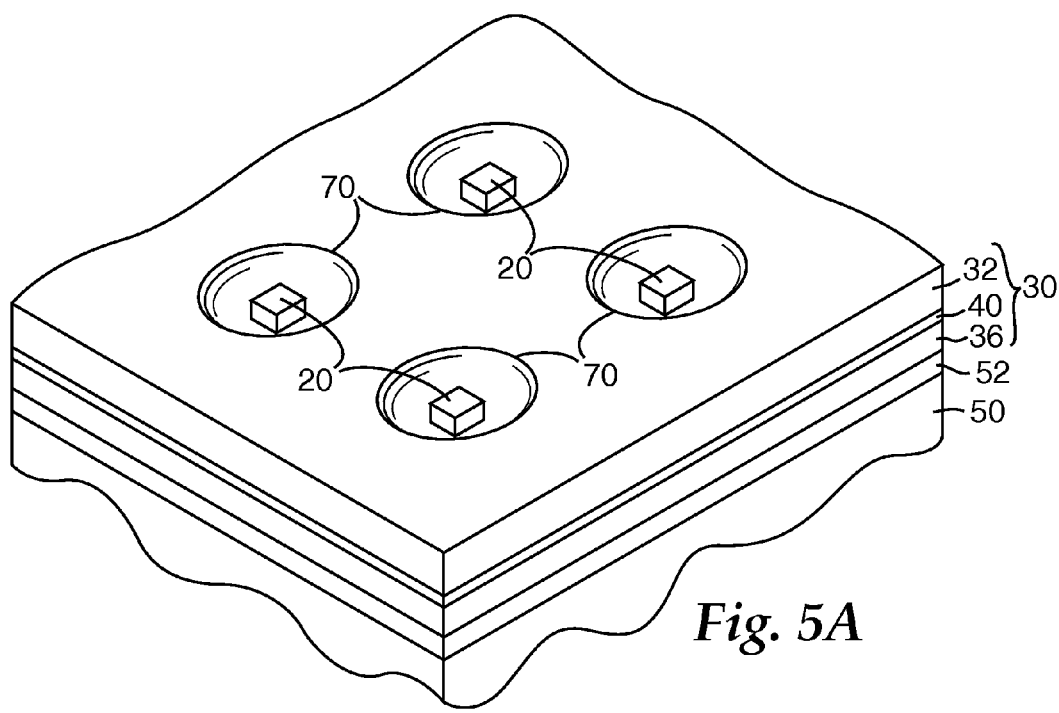
FIG. 5A is a perspective illustration of an illumination assembly having a plurality of inwardly projecting deformations having LEDs disposed therein.
Figure 5B:
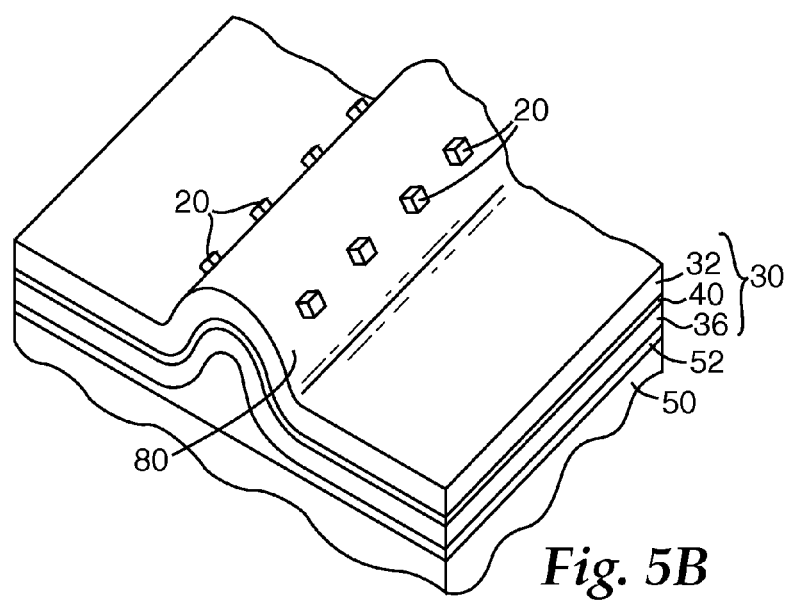
FIG. 5B is a perspective illustration of an illumination assembly having an outwardly projecting deformation having LEDs disposed thereon.

As described above, substrate 30 is a compliant material that can be permanently deformed under moderate pressures to include protrusions or depressions that are isolated to only a portion of the substrate 30, such that if the substrate 30 is laid flat, the deformations are bounded on all sides by flat portions of the substrate 30. When the substrate is deformed, the insulating layer 40 remains intact and adherent (i.e., the insulating layer 40 does not crack, fracture or delaminate from first and second electrically conductive layers 32, 36). FIGS. 5A and 5B provide perspective views of a portion of illumination assemblies having deformations in the substrate 30, where LED dies 20 are disposed in or on the deformations. In both FIGS. 5A and 5B, for purposes of clarity and illustration, circuit traces and wirebonds are not shown.

In FIG. 5A, a plurality of substantially hemispherical depressions 70 (i.e., dimples) extend below the top surface 34 of substrate 30, and an LED die 20 is disposed in each depression 70. The LED dies 20 are illustrated as being disposed substantially at the bottom center of the depressions 70, such that LED dies 20 emit light in a direction substantially orthogonally aligned with the upper surface 34 of the substrate 30. In other embodiments, some, or all of the LED dies 20 can be disposed on an inclined surface of their respective depression 70, such that at least some LED dies 20 emit light obliquely with respect to the upper surface 34 of the substrate 30.

In FIG. 5B, an elongated protrusion 80 (i.e., a ridge) extends above the top surface 34 of substrate 30, and a plurality of LED dies 20 are disposed on the protrusion 80. The LED dies 20 are illustrated as being disposed on both inclined surfaces of the protrusion, such that the LED dies emit light in oblique directions with respect to the upper surface 34 of the substrate 30. In other embodiments, LED dies can be mounted on the uppermost portion of the protrusion 80, and LED dies 20 may be mounted on only one, or less than all inclined surfaces of the protrusion 80.

The individual deformations of substrate 30 may be configured to receive a single LED die, die clusters, or banks or rows of LED dies. In some embodiments, more than one LED (e.g. LEDs having respective red, green, and blue color outputs) are closely positioned in a localized area, such as on or in a single deformation, to generate apparent white light. The shape of the deformation alone, or the shape of the deformation in combination with an optional encapsulant and/or an optical film, can be configured to enhance color mixing.

It is understood that the shapes and arrangements of depressions 70 and protrusion 80 in FIGS. 5A and 5B are illustrative only, and are in no way intended to be limiting. Deformations in substrate 30 may be of any shape or arrangement as is useful in the intended application of the illumination assembly 10, and include deformations having smoothly varying surfaces, as in the case of a hemisphere, or piecewise discontinuous surfaces, as in the case of a pyramidal shape with flat facets. The deformations may be asymmetrical or symmetrical, e.g. an elliptical depression rather than a hemispherical depression. In some embodiments, the deformations have compound curvature. In some embodiments, the deformations have lateral dimensions on the same order of magnitude as lateral dimensions of the LED dies 20.

Figure 7:
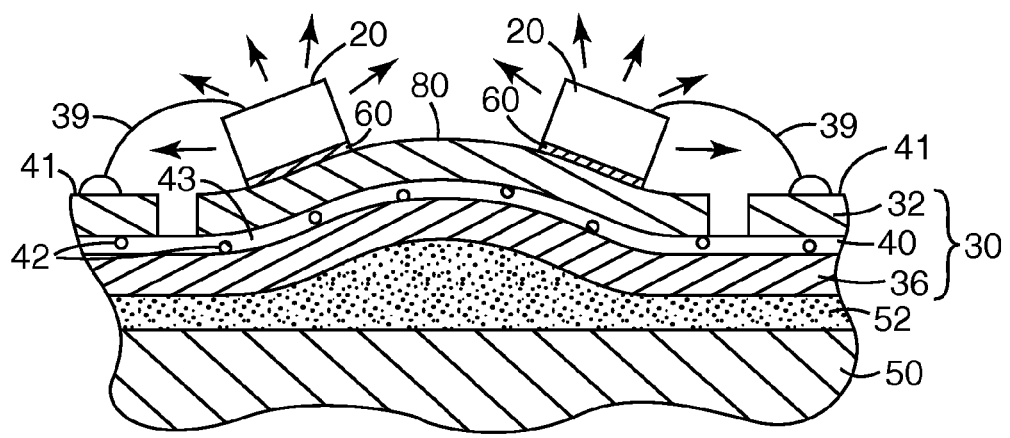
FIG. 7 is a cross-sectional illustration of an illumination assembly with a compliant substrate having an outwardly projecting deformation with LEDs disposed thereon, wherein a thermal interface material conforms to the deformed substrate.
Figure 6A:
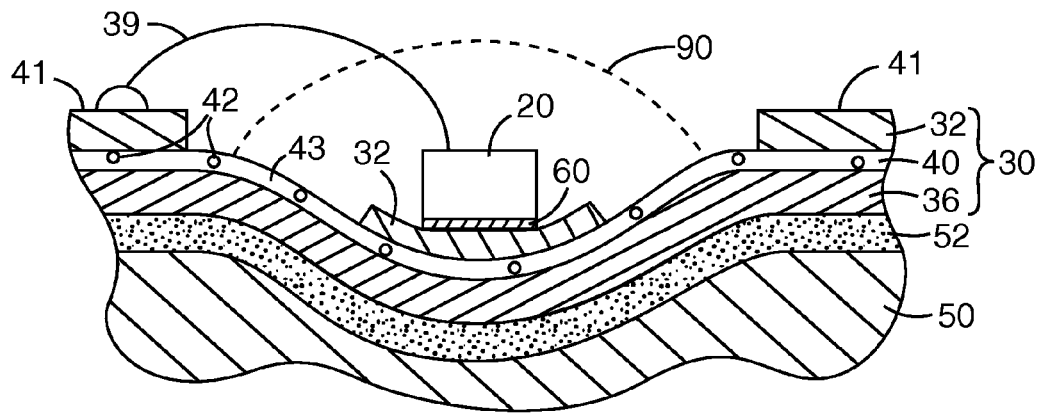
FIG. 6A is a cross-sectional illustration of an illumination assembly with a compliant substrate having an inwardly projecting deformation with an LED disposed therein, wherein the substrate is conformably attached to a substrate.

Referring now to FIGS. 6A through 7, exemplary cross-sectional illustrations of the compliant substrate 30 are provided in which compliant substrate 30 has a deformation, and at least one LED die 20 is disposed on or in the deformation.

In FIG. 6A, the patterned compliant substrate 30 has been deformed to form a depression (such as depressions 70 of FIG. 5A) of sufficient size to receive LED die 20 on a bottom surface of the depression. As described above, conductive adhesives, anisotropically conductive adhesives, or solder re-flow are among the attachment methods that can be used to attach the LED die 20 to the first conductive layer 32. In the illustrated embodiment, heat dissipation assembly 50 has been preformed with the desired depression, and substrate 30 is conformably attached to heat dissipation assembly 50 by layer 52 of thermal interface material having relatively constant thickness between substrate 30 and heat dissipation assembly 50. An optional encapsulant 90 is illustrated covering LED die 20.

Figure 6B:
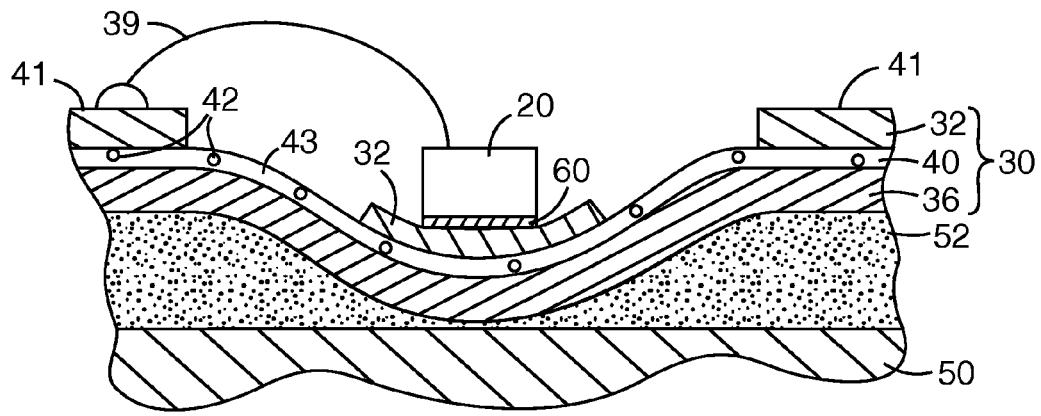
FIG. 6B is another cross-sectional illustration of an illumination assembly with a compliant substrate having an inwardly projecting deformation with an LED disposed therein, wherein a thermal interface material conforms to the deformed substrate.

FIG. 6B shows a portion of an illumination assembly similar to that of FIG. 6A, but wherein the heat dissipation assembly 50 has a substantially flat surface to which substrate 30 is attached. The layer 52 of thermal interface material is displaced by the depression 70 and conforms to the shape of substrate 30. The reduced thickness of layer 52 reduces the thermal impedance from the layer of thermal interface material.

Figure 6C:
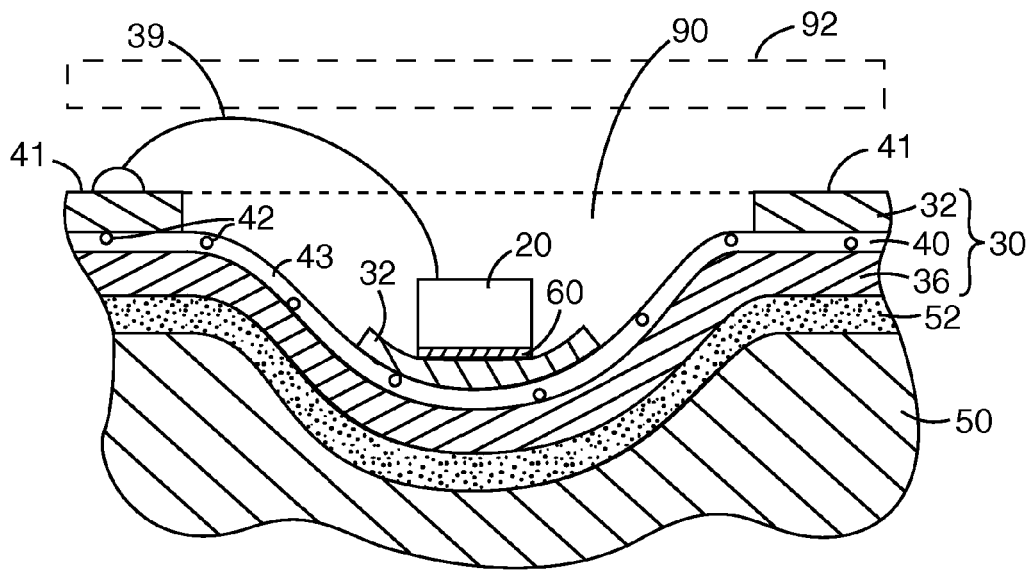
FIG. 6C is a cross-sectional illustration of an illumination assembly with a compliant substrate similar to FIG. 6A, showing optional use with an encapsulant and optical film.

FIG. 6C also shows a portion of an illumination assembly similar to that of FIG. 6A, but wherein the depression 30 has a depth greater than the height of LED die 20. In the embodiment of FIG. 6C, an optional encapsulant 90 is shown filling the depression 70 substantially flush with the top surface of the substrate 30, and one or more optional optical film(s) 92, such as a diffusing film, a polarizing film (such as any of the Vikuiti™ DBEF films available from 3M Company), or a structured surface film (such as any of the Vikuiti™ BEF films available from 3M Company), are used in combination with the assembly. In other embodiments, depression 70 may have no encapsulant 90, or be less then full of encapsulant 90.

Referring now to FIG. 7, the patterned compliant substrate 30 has been deformed to form a protrusion 80. As described above, conductive adhesives, anisotropically conductive adhesives, or solder re-flow are among the attachment methods that can be used to attach the LED dies 20 to the first conductive layer 32. Heat dissipation assembly 50 has a substantially flat surface to which substrate 30 is attached, and the layer 52 of thermal interface material conforms to the deformed shape of substrate 30. In other embodiments, the heat dissipation assembly can be preformed with the desired shape of protrusion 80, and substrate 30 can be conformably attached to heat dissipation assembly 50 by layer 52 of thermal interface material.

The exemplary embodiments described herein are particularly useful when used in combination with known encapsulants and/or known optical films. For example, encapsulants having a phosphor layer (for color conversion) or otherwise containing a phosphor can be used on or around the LED die 20 without degrading the LED die light output. Encapsulants can be used in conjunction with deformations in substrate 30 having any shape or configuration, including deformations extending below the upper surface 34 of the substrate 30, and deformations protruding above the upper surface 34 of the substrate 30.

Figure 8:
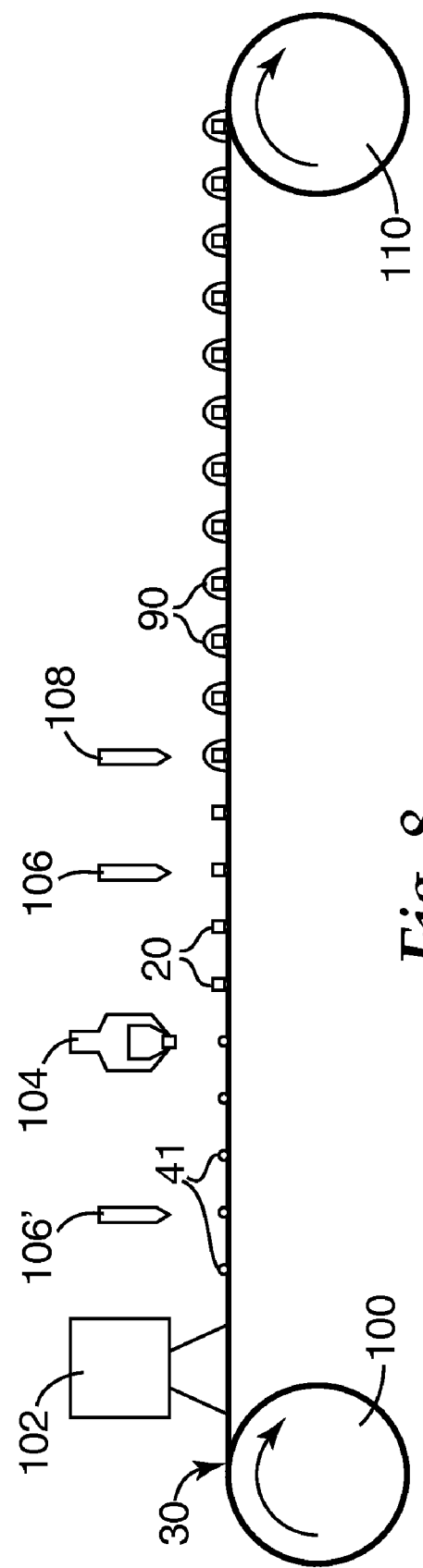
FIG. 8 is a schematic illustration of one method of making an illumination assembly.

Referring now to FIG. 8, in making an illumination assembly 10, the compliant substrate 30 as described above is provided, such as by unwinding a supply roll 100 of the compliant substrate, and the first electrically conductive layer 32 is patterned at patterning station 102 to form the desired circuit traces 41. Patterning of layer 32 may be accomplished using any traditional circuit construction technique. LED dies 20 are attached to the patterned first electrically conductive layer 32 at die attach station 104 using known and conventional die attach and wire bonding methods as described above. The compliant substrate 30, having LED dies 20 thereon, is then deformed at shaping station 106 to provide the desired surface features (i.e., depressions, protrusions or combinations there) to substrate 30, with locations of the surface features corresponding to locations of the LED dies 20. Next, encapsulant 90 is optionally applied at encapsulation station 108 and thereafter cured before the substrate 30 with LED dies 20 thereon is wound onto take-up roll 110. In othercases, deforming of the compliant substrate 30 can be performed before the LED dies 20 are attached, as indicated by shaping station 106'. In some cases, instead of being wound onto take-up roll 110, the compliant substrate 30 having LED dies 20 thereon is cut at intervals to provide a plurality of illumination assembly strips, panels, or other shapes suitable for mounting in a backlight, for use e.g. in backlit displays, signs, or graphics. In stil other cases, the take-up roll 110 can become a supply roll for subsequent processing steps.

Deforming of the substrate 30 with LED dies 20 thereon may be accomplished using many different techniques. In one technique, one or more blunt objects of the desired shape can be pressed by hand in the compliant substrate to form the desired depressions or protrusions. In another technique, the substrate 30 with LED dies 20 thereon is embossed or stamped using tools configured to prevent damage to LED dies 20 or the electrical interconnections thereof. Preferably, a shaped tool with one or more desired deformations is provided. The compliant substrate is positioned relative to the tool at a sequence of one or more locations and the tool pressed onto the compliant substrate to thereby deform the substrate with the desired pattern. The stamping operation can use air pressure, mechanical means, hydraulic pressure, or other methods of stamping, embossing, or coining objects known in the art.

If desired, the substrate 30 with LED dies 20 thereon can be conformably attached to a support surface (such as heat dissipation assembly 50) which includes the desired features. The support surface may be partially or fully formed to the desired final form of the substrate 30 prior to bonding of the substrate 30 to the support surface, or the support surface may be formed at the same time the substrate 30 is deformed to create the desired surface features. Shaping or deforming of the substrate 30 to the support surface features may be accomplished using techniques including vacuum molding/pressing, or laminating with or without heat and/or pressure.

The disclosed compliant substrate can be used not only with LED dies as discussed above, but with other circuit components, particularly components that generate substantial heat. Thus, we contemplate assemblies similar to the foregoing disclosed illumination assemblies but wherein some or all of the LED dies are replaced by one or more of: organic light emitting diodes (OLEDs), solid state lasers, power transistors, integrated circuits (ICs), and organic electronics.

Unless otherwise indicated, all numbers expressing quantities, measurement of properties, and so forth used in the specification and claims are to be understood as being modified in all instances by the term "about." Accordingly, unless indicated to the contrary, the numerical parameters set forth in the specification and claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The foregoing description is illustrative and is not intended to limit the scope of the invention. Variations and modifications of the embodiments disclosed herein are possible, and practical alternatives to and equivalents of the various elements of the embodiments would be understood to those of ordinary skill in the art upon study of this patent document. These and other variations and modifications of the embodiments disclosed herein may be made without departing from the scope and spirit of the invention.

The invention claimed is:

1. An illumination assembly, comprising:
a compliant substrate comprising a first and second electrically conductive foil separated by an electrically insulating layer, the insulating layer comprising a polymer material loaded with particles that enhance thermal conductivity of the insulating layer, wherein the particles are oriented to provide diffractive optical properties to the insulating layer; and
a plurality of LED dies disposed on the first conductive foil,
wherein the compliant substrate has at least one deformation, and at least one of the LED dies is disposed on or in the deformation, and
wherein the at least one LED die is disposed on an inclined surface of the deformation such that the LED die emits light obliquely with respect to the compliant substrate.

2. An illumination assembly, comprising:
a compliant substrate comprising a first and second electrically conductive foil separated by an electrically insulating layer, the insulating layer comprising a polymer material loaded with particles that enhance thermal conductivity of the insulating layer, wherein the particles are oriented to effect polarization of light incident upon the insulating layer; and
a plurality of LED dies disposed on the first conductive foil,
wherein the compliant substrate has at least one deformation, and at least one of the LED dies is disposed on or in the deformation, and
wherein the at least one LED die is disposed on an inclined surface of the deformation such that the LED die emits light obliquely with respect to the compliant substrate.

* * * * *